(12) United States Patent
Kim

(10) Patent No.: US 7,491,571 B2
(45) Date of Patent: Feb. 17, 2009

(54) METHOD OF MANUFACTURING AN IMAGE SENSOR HAVING MICROLENSES FORMED UNDER HIGH PRESSURE

(75) Inventor: Sang Sik Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/611,273

(22) Filed: Dec. 15, 2006

(65) Prior Publication Data

US 2008/0014674 A1 Jan. 17, 2008

(30) Foreign Application Priority Data

Dec. 28, 2005 (KR) ................ 10-2005-0131372

(51) Int. Cl.
*H01L 21/00* (2006.01)
(52) U.S. Cl. ............... 438/69; 438/70; 257/E31.128
(58) Field of Classification Search ............ 438/48, 438/70, 66; 257/E21.127
See application file for complete search history.

(56) References Cited

U.S. PATENT DOCUMENTS

| | | | | |
|---|---|---|---|---|
| 5,623,368 A | * | 4/1997 | Calderini et al. ............ | 359/619 |
| 6,171,885 B1 | * | 1/2001 | Fan et al. ..................... | 438/70 |
| 6,586,811 B2 | * | 7/2003 | Sekine ........................ | 257/432 |
| 6,974,717 B2 | * | 12/2005 | Izumi et al. .................. | 438/57 |
| 2001/0051405 A1 | * | 12/2001 | Sekine ........................ | 438/208 |
| 2002/0197763 A1 | * | 12/2002 | Yeh et al. ..................... | 438/70 |
| 2003/0168679 A1 | * | 9/2003 | Nakai et al. ................. | 257/291 |
| 2004/0262705 A1 | * | 12/2004 | Izumi et al. ................. | 257/432 |
| 2007/0035844 A1 | * | 2/2007 | Li et al. ...................... | 359/619 |

FOREIGN PATENT DOCUMENTS

KR 10-2003-0091462 6/2005
KR 2005059739 A * 6/2005

* cited by examiner

*Primary Examiner*—W. David Coleman
*Assistant Examiner*—Shaka Scarlett
(74) *Attorney, Agent, or Firm*—Saliwanchik, Lloyd & Saliwanchik

(57) ABSTRACT

A method for manufacturing an image sensor is provided. The method includes: forming a plurality of photodiodes on a semiconductor substrate; forming an interlayer dielectric on the semiconductor substrate; forming a color filter layer on the interlayer dielectric; forming a planarization layer on the color filter layer; and forming microlenses on the planarization layer under high temperature and pressure.

6 Claims, 4 Drawing Sheets

METHOD OF MANUFACTURING AN IMAGE SENSOR HAVING MICROLENSES FORMED UNDER HIGH PRESSURE

RELATED APPLICATION(S)

This application claims priority under 35 U.S.C. §119(e) of Korean Patent Application No. 10-2005-0131372 filed Dec. 28, 2005, which is incorporated herein by reference in its entirety.

FIELD OF THE INVENTION

The present invention relates to a method for manufacturing a semiconductor device.

BACKGROUND OF THE INVENTION

In general, an image sensor is a semiconductor device for converting an optical image into electrical signals, and may be classified as a Charge Coupled Device (CCD) image sensor or a Complementary Metal Oxide Semiconductor (CMOS) image sensor.

A CMOS image sensor includes a photodiode for detecting emitted light, and a logic circuit for converting the detected light into electrical signals and generating data from the electrical signals. As the amount of light received in the photodiode increases, the photo sensitivity of the image sensor becomes better.

In order to improve the photo sensitivity of a CMOS image sensor, various methods have been employed. One method increases a fill factor of a photodiode with respect to the entire area of an image sensor. Another method incorporates a light condensing technology, which changes the path of light incident into an area not having a photodiode, thereby causing light to be concentrated to the photodiode.

One example of the light condensing technology is to form a microlens. In particular, a convex microlens made from a material having good light transmittance is formed on the upper portion of the photodiode, and refracts the path of incident light, thereby causing more light to be incident into the photodiode.

In such a case, light parallel with the optical axis of the microlens is refracted by the microlens, and the focus of the light is formed at a certain position on the optical axis.

In general, an image sensor includes a photodiode, an interlayer dielectric, a color filter, and a microlens.

The interlayer dielectric is formed on a semiconductor substrate having a plurality of photodiodes formed therein, and red, green, and blue (RGB) color filter layers are formed on the interlayer dielectric so as to correspond to the photodiodes.

A planarization layer is formed on the color filter layer in order to planarize a surface of the color filter layers, and microlenses are formed on the planarization layer corresponding to the color filter layers.

In operation, the photodiode converts detected light into electrical signals, the interlayer dielectric insulates metal wirings, the color filter expresses the three primary colors RGB of light, and the microlens causes light to be concentrated to the photodiode.

Hereinafter, a conventional process for forming a microlens will be described with reference to the accompanying drawings.

FIGS. 1a to 1d are sectional views illustrating a process for forming a microlens according to the prior art.

As illustrated in FIG. 1a, a microlens layer 52 is formed on a semiconductor substrate 10, having a plurality of photodiodes 40, on which an interlayer dielectric 20, a color filter layer 30 and a planarization layer 25 have been formed.

Referring to FIG. 1b, the microlens layer 52 is patterned so as to correspond to the photodiodes 40, respectively.

Referring to FIG. 1c, the semiconductor substrate 10 is placed on a hot plate 60, and then is heated to reflow the microlens layer 52 to form the microlenses 50 shown in FIG. 1d.

Referring to FIG. 1d, the microlenses 50 are non-uniformly formed as illustrated by references A and B.

When the semiconductor substrate 10 including the microlens layer 52 is located on the hot plate 60 and directly heated, the heat transfer coefficient, or thermal capacity, locally differs depending on the heat transfer paths below the microlens layer 52. In addition, the heat transfer amount may locally differ by a step difference. Therefore, non-uniform thermal flowing occurs. Accordingly, non-uniform microlenses 50 are formed.

When the microlenses 50 attach to each other and are unequally spaced apart as illustrated by reference A of FIG. 1d, or the curved surfaces of the microlenses 50 are distorted as illustrated by reference B of FIG. 1d, the non-uniformity may affect adjacent pixels, and concentration efficiency may deteriorate.

BRIEF SUMMARY

Accordingly, embodiments of the present invention are directed to a method for manufacturing a semiconductor device that can substantially obviate one or more problems due to limitations and/or disadvantages of the related art.

An object of embodiments of the present invention is to provide an image sensor manufacturing method capable of forming a uniform microlens.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In accordance with one embodiment of the present invention, there is a method for manufacturing an image sensor, the method including: forming a plurality of photodiodes in a semiconductor substrate; forming an interlayer dielectric on the semiconductor substrate; forming a color filter layer on the interlayer dielectric; forming a planarization layer on the color filter layer; and forming microlenses on the planarization layer under high pressure.

According to an embodiment, gases can be injected inside the pressure chamber to form a high pressure, so that heat can be uniformly applied to the microlenses. Accordingly, adjacent microlenses can be prevented from being attached to each other. Further, the surface of the microlens can be uniformly formed by the pressure without distortion, so that sensitivity and color reproducibility can be improved. As a result, it is possible to manufacture an image sensor of high quality.

In addition, the time and pressure can be adjusted, rather than just the time and temperature adjusted in the related art so that a microlens with a desired curvature can be rapidly formed.

In many embodiments, forming the microlenses on the planarization layer includes: forming a microlens layer on the planarization layer; patterning the coated microlens layer; providing the semiconductor substrate including the microlens layer within a pressure chamber; and injecting gases inside the pressure chamber while applying heat by using a hot plate to form a microlens having a curved surface.

The gases injected inside the pressure chamber can uniformly apply heat to the microlenses because the gases absorb heat from a region receiving excess thermal energy from the hot plate and transfers the heat to a region receiving little thermal energy. Therefore, heat can be uniformly applied to the microlens, and uniform microlenses can be obtained.

In a preferred embodiment, the gases can be injected inside the pressure chamber to form high pressure of 2-10 atm.

The gases can be inert gases.

It is preferable to use inert gases because the process can be performed at high temperatures. Accordingly, when the inert gases are not used, the microlens may not be stable in high temperature.

It is preferred that the inert gases include air, $N_2$ or $O_2$, which can be easily obtained and are stable at high temperatures.

In a further embodiment, a plasma process can be performed to reform the surface of the microlens if the microlens formed under the high pressure does not have a smooth surface.

The plasma process can be performed within the pressure chamber having a plasma processing apparatus therein.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, a method for manufacturing an image sensor according to preferred embodiments of the present invention will be described with reference to the accompanying drawings.

FIGS. 2a to 2e are sectional views illustrating a process for manufacturing an image sensor according to an embodiment of the present invention.

Figure 1A:
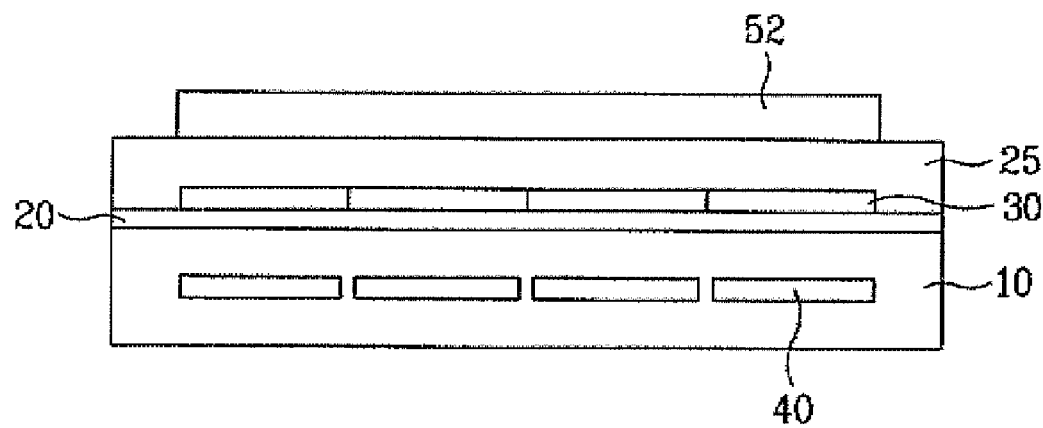
FIGS. 1a to 1d are sectional views illustrating a process for forming a microlens according to the prior art.
Figure 1B:
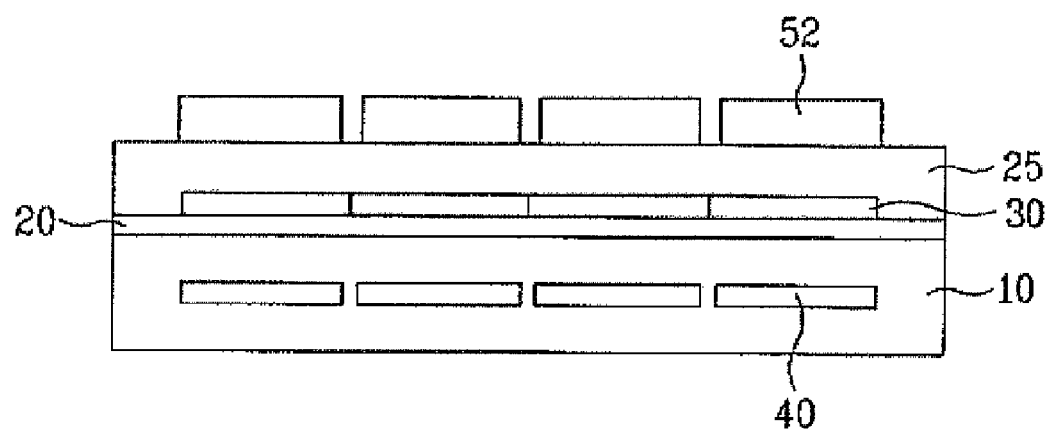
Figure 1C:
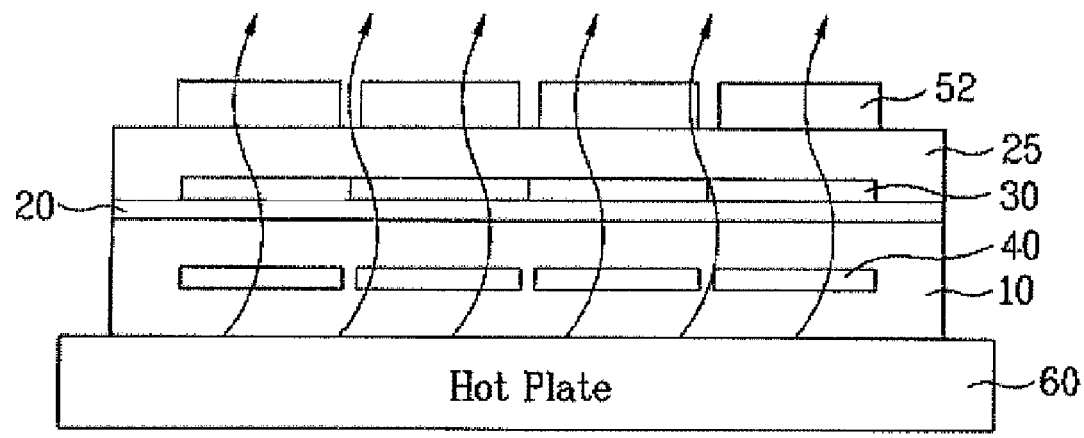
Figure 1D:
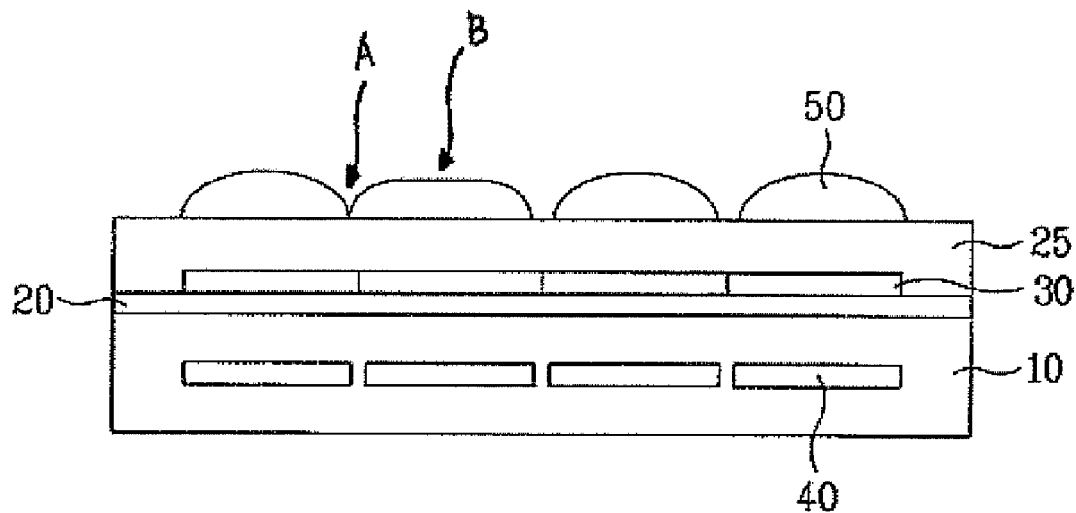
Figure 2A:
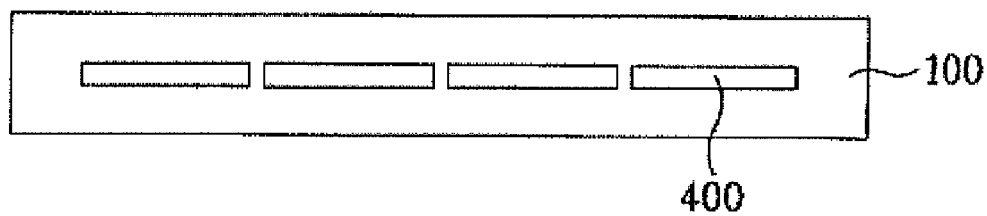
FIGS. 2a to 2e are sectional views illustrating a process for manufacturing an image sensor according to an embodiment of the present invention.

Referring to FIG. 2a, a semiconductor substrate 100 including a plurality of photodiodes 400 formed therein can be provided.

Figure 2B:
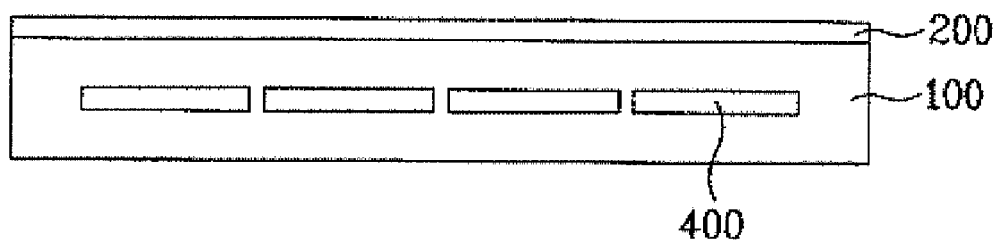

Referring to FIG. 2b, an interlayer dielectric 200 can be formed on the semiconductor substrate 100.

In an embodiment, the interlayer dielectric 200 can be made of SiN or SiON.

Figure 2C:
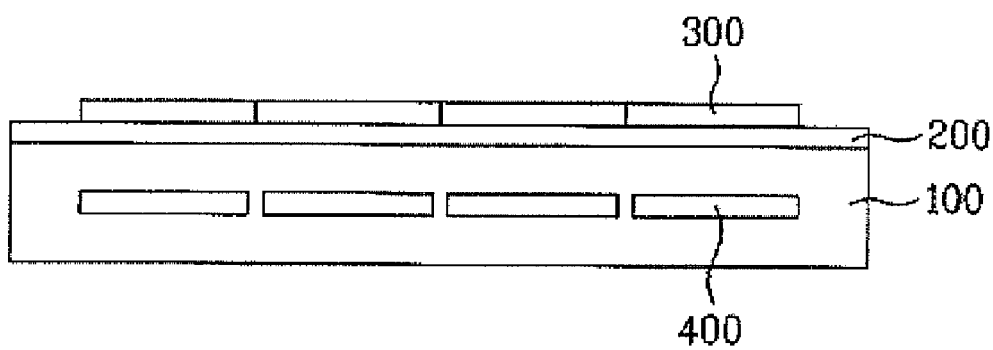

Referring to FIG. 2c, color filter layers 300 can be formed on the interlayer dielectric 200.

The color filter layers 300 can be formed by coating dyable resist on the interlayer dielectric 200, and performing exposure and development processes.

The color filter layers 300 can be formed on the interlayer dielectric vertically above the photodiodes 400. That is, the color filter layers 300 can be formed in positions to correspond to the photodiodes 400, so that light can be incident into the photodiodes 400 through their respective color filter layers 300.

Figure 2D:
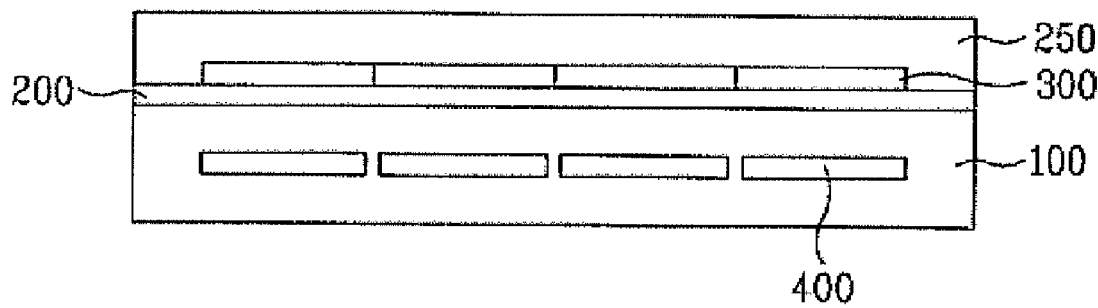

Referring to FIG. 2d, a planarization layer 250 can be formed on the color filter layers 300.

The planarization layer 250 protects the color filter layers 300, and allows microlenses formed on the upper portion of the planarization layer 250 to be smoothly formed. Further, the planarization layer 250 can be made from an organic material having good transparence in a visible ray area. In an embodiment, the planarization layer can have a thickness of 0.5 to 1.5 μm for adjustment of the focal distance.

Figure 2E:
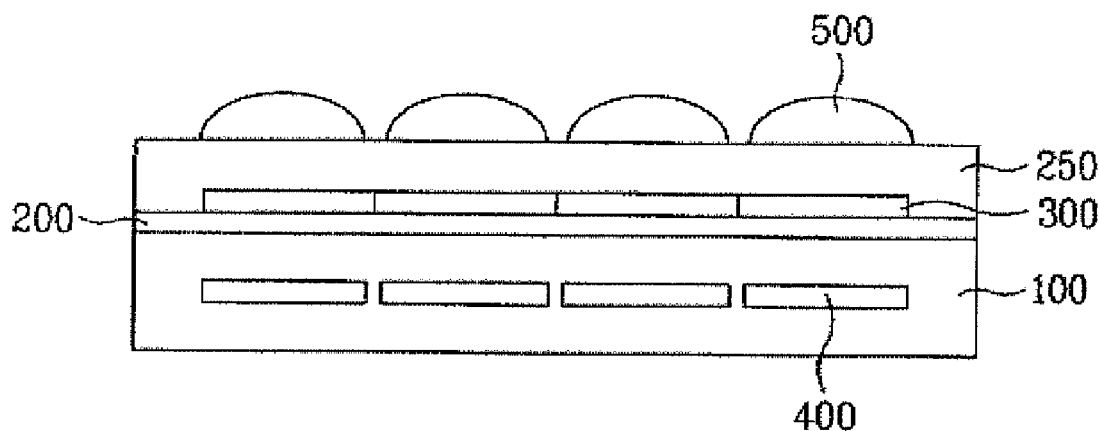

Referring to FIG. 2e, microlenses 500 can be formed on the planarization layer 250 to complete formation of an image sensor.

Herein, the microlenses 500 can be formed so as to correspond to the photodiodes 400 and the color filter layers 300, respectively.

The microlenses 500 can be made from photoresist or an insulator which has insulation characteristics and allows transmission of light.

Figure 3A:
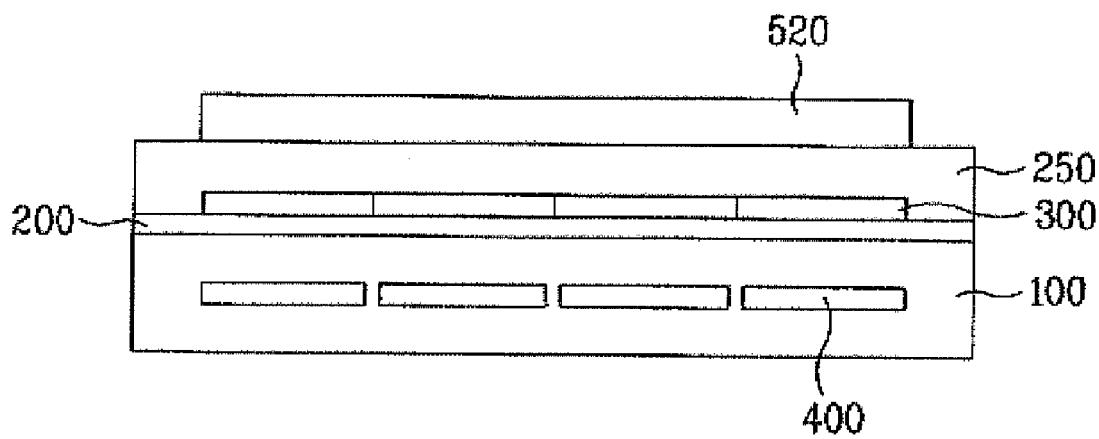
FIGS. 3a to 3d are sectional views illustrating a process for forming a microlens according to an embodiment of the present invention.

FIGS. 3a to 3d are sectional views illustrating a process for forming a microlens according to an embodiment of the present invention Referring to FIG. 3a, a microlens layer 520 can be formed on a semiconductor substrate 100 having the photodiodes 400, on which an interlayer dielectric 200, a color filter layer 300, and a planarization layer 250 have been formed.

Figure 3B:
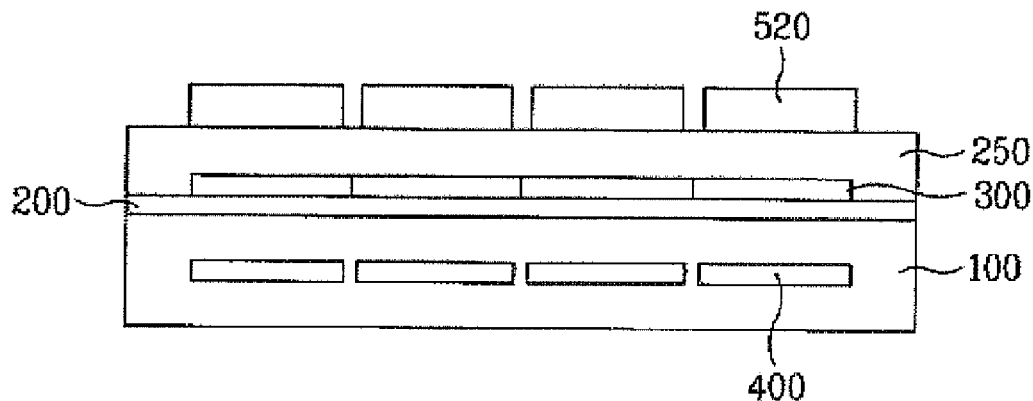

Referring to FIG. 3b, the microlens layer 520 can be patterned so as to correspond to the photodiodes 400, respectively.

In an embodiment, after a mask having a predetermined pattern is located on the microlens layer 520, and light is irradiated to the mask, the microlens layer 520 can be patterned through a development process.

Figure 3C:
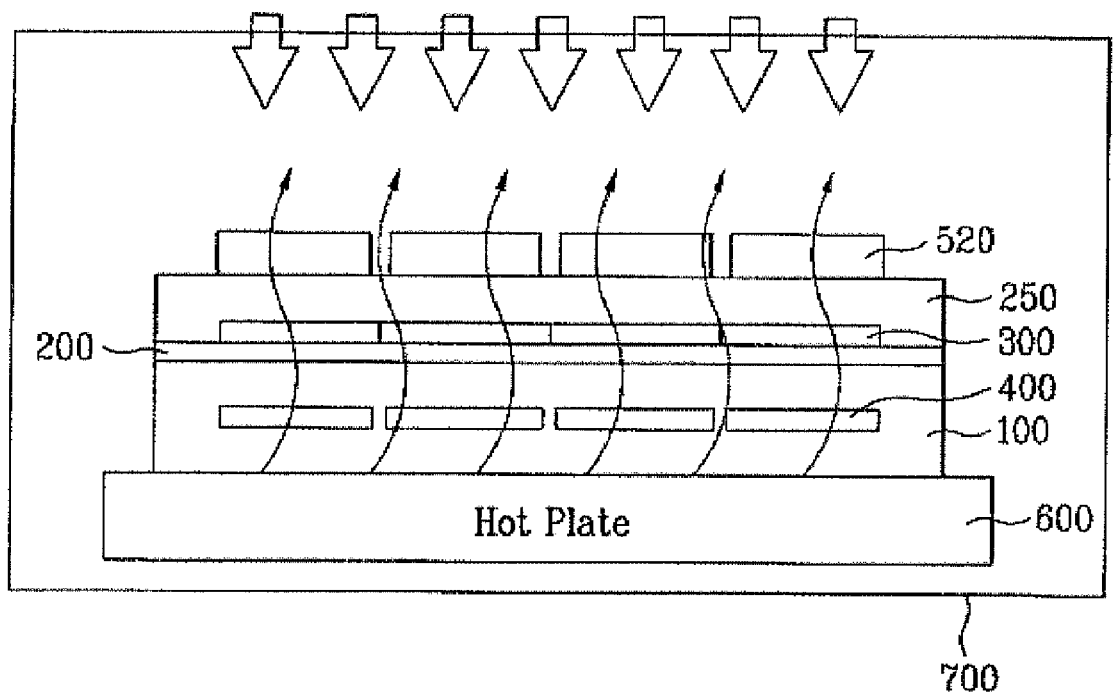
Figure 3D:
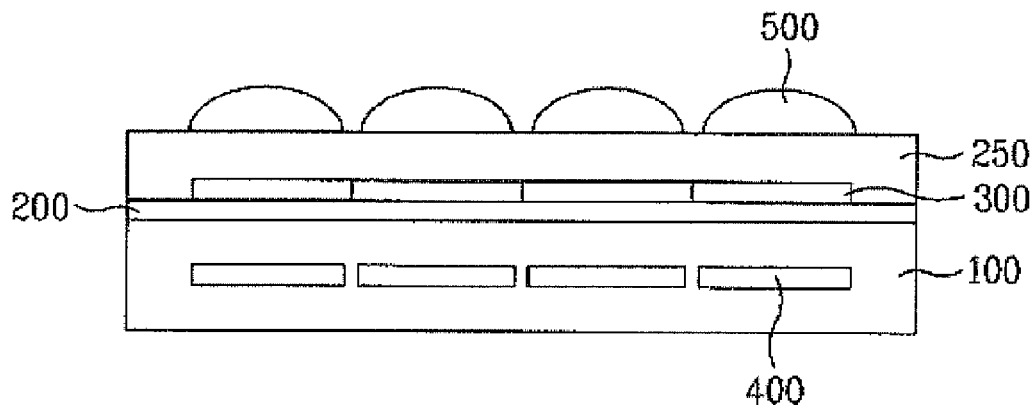

Referring to FIG. 3c, the semiconductor substrate 100 including the patterned microlens layer 520 can be placed within a pressure chamber 700. Gases can be injected inside the pressure chamber 700 while applying heat to the substrate 100 by using a hot plate 600. The injected gases can provide high pressure in the pressure chamber 700.

The gases injected inside the pressure chamber 700 can uniformly distribute the heat transferred from the hot plate 600, so that uniform microlenses can be formed.

In a specific embodiment, during formation of the microlenses 500, the gases injected inside the pressure chamber 700 can provide a pressure of 2-10 atm, and the hot plate can have a temperature of 150 to 200° C.

The gases injected inside the pressure chamber 700 can be inert gases in consideration of stability at high temperatures.

In one embodiment, air, $N_2$ or $O_2$ can be used as the inert gases.

Air, $N_2$ and $O_2$ can be easily obtained and are stable at high temperatures.

When the microlens formed under high pressure does not have a smooth surface, plasma processing can be performed in order to reform the surface of the microlens.

The plasma processing does not need to be separately performed, but can be performed within the pressure chamber additionally having a plasma processing apparatus therein.

According to embodiments, gases can be injected inside the pressure chamber to form a high pressure for uniformly applying heat to the microlenses. Therefore, adjacent microlenses can be prevented from being attached to each other. In addition, the surfaces of the microlenses can be uniformly formed by the pressure without distortion, so that sensitivity and color reproducibility can be improved. As a result, it is possible to manufacture an image sensor of high quality.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing an image sensor, comprising:
   forming a plurality of photodiodes on a semiconductor substrate;
   forming an interlayer dielectric on the semiconductor substrate;
   forming a color filter layer on the interlayer dielectric;
   forming a planarization layer on the color filter layer; and
   forming microlenses on the planarization layer under an increased pressure, wherein forming the microlenses on the planarization layer under increased pressure comprises:
   forming a microlens material layer on the planarization layer;
   patterning the microlens material layer;
   providing the semiconductor substrate having the patterned microlens material layer within a pressure chamber; and
   injecting gases inside the pressure chamber while using a hot plate to apply heat, wherein injecting the gases inside the pressure chamber comprises injecting inert gases to provide the increased pressure, wherein the injected gases include oxygen.

2. The method according to claim 1, wherein the hot plate applies a temperature of 150 to 200° C.

3. The method according to claim 1, wherein the planarization layer is formed of an organic material and has a thickness of 0.5 to 1.5 μm.

4. The method according to claim 1, wherein the interlayer dielectric is formed of SiN or SiON.

5. The method according to claim 1, further comprising performing plasma processing for reforming a surface of the microlenses after forming the microlenses on the planarization layer.

6. The method according to claim 1, wherein the increased pressure is a pressure of 2-10 atm.

* * * * *